United States Patent [19]
Crandall

[11] 4,091,332
[45] May 23, 1978

[54] TRAVELING WAVE TUBE AMPLIFIER EMPLOYING FIELD EMISSION CATHODES

[75] Inventor: Walter Ellis Crandall, Malibu, Calif.

[73] Assignee: Northrop Corporation, Los Angeles, Calif.

[21] Appl. No.: 765,197

[22] Filed: Feb. 3, 1977

[51] Int. Cl.² ............................................. H03F 3/58
[52] U.S. Cl. ..................................... 330/43; 315/39.3; 330/56
[58] Field of Search ................. 313/336; 315/39, 39.3; 330/43, 56

[56] References Cited

U.S. PATENT DOCUMENTS

| | | | |
|---|---|---|---|
| 2,654,004 | 9/1953 | Bailey | 330/43 X |
| 3,581,148 | 5/1971 | Brignet | 313/336 X |
| 3,755,704 | 8/1973 | Spindt et al. | 313/336 X |

*Primary Examiner*—Lawrence J. Dahl
*Attorney, Agent, or Firm*—Edward A. Sokolski

[57] ABSTRACT

An array of field emission cathodes is formed by a plurality of pointed cold cathode elements arranged in rows and columns along microwave transmission means such as a waveguide or transmission line, into which low power microwave energy to be amplified is fed. Arranged opposite the cathode array in spaced relationship therewith is an anode structure. Running along the anode structure is a second microwave transmission means for receiving and coupling out the amplified input energy. Positioned between the anode and the cathode are a plurality of grid members for controlling the electron flow between the cathodes and the anode.

13 Claims, 7 Drawing Figures

TRAVELING WAVE TUBE AMPLIFIER EMPLOYING FIELD EMISSION CATHODES

This invention relates to traveling wave tube amplifiers for amplifying microwave energy, and more particularly to such an amplifier employing a field emission cathode.

Traveling wave tubes have been used for some time for amplifying microwave energy. For example, traveling wave tubes of the prior art employ a helically wound coil which is positioned in the path of a beam of electrons generated by means of a thermionic cathode. This type of device is described on pages 678–683 of *Electronic and Radio Engineering,* Fourth Edition, by F. E. Terman, published in 1955 by McGraw Hill Book Company. Microwave signals to be amplified are fed to the helix and this input energy is amplified along the length of the helix by virtue of energy delivered to the signal from the electrons in the beam. This type of amplifier has been found very useful for generating high power energy at frequencies of the order of 500–10,000 megahertz and has broad band characteristics of the order of 2,000 megahertz.

In prior art traveling wave tube amplifiers, a very strong magnetic field is needed to focus the electron beam requiring a substantial amount of power. In addition, the generation of the strong magnetic field required produces undesirable stray fields which can cause interference with other equipment in the vicinity. Further, in prior art traveling wave tubes the helical coil employed must be of very miniature proportions and is somewhat difficult and expensive to fabricate. Also, in the generation of high power, the miniature helical coil tends to overheat, presenting a cooling problem.

The device of the present invention overcomes the aforementioned difficulties encountered with prior art traveling wave tubes by eliminating the use of a helical coil in its implementation. The device of the present invention further requires no high power focusing field and thus eliminates the power requirements for generating such a field, as well as avoiding the generation of stray magnetic fields present in the prior art. In addition, the device of the present invention is believed to have broader band characteristics than prior art traveling wave tube amplifiers.

It is therefore an object of this invention to provide improved means for amplifying microwave energy.

It is a further object of this invention to facilitate and economize the fabrication of traveling wave tube amplifiers.

Other objects of this invention will become apparent as the description proceeds in connection with the accompanying drawings, of which:

Briefly described, my invention is as follows: A plurality of field emission cathode elements are arranged in an array formed by pointed cold cathode elements placed in rows and columns to cover a predetermined area. Microwave transmission means, which may be in the form of a transmission line which is formed by a grind structure and the cathode structure, has low power microwave energy to be amplified coupled thereto. Placed opposite the cathodes array in spaced relationship thereto on the opposite side of the grid structure from the cathode and covering substantially the same area thereas is an anode member which may be in the form of a flat plate. The grids which have various potentials applied thereto are used for controlling the flow of electrons between the cathode and anode members. Formed by the anode and the grid structure is a second microwave transmission element, which may be in the form of a transmission line utilized for collecting and coupling out the amplified high power microwave energy. Electrons are emitted from the pointed field emission cathodes in response to the electric field generated by virtue of potentials applied to the anode and certain of the grids. These electrons are in effect modulated by the low power microwave field applied to the input transmission means, which may comprise a transmission line formed by the cathode-grid structure. The microwave energy to the cathode-grid transmission line is substantially amplified through the transmission of the modulated electron beam to the anode-grid transmission line structure. The energy from the various cathodes in the array is added together at the anode in in-phase relationship determined by the signal velocity in the transmission line (traveling wave), and is coupled out from the traveling wave tube to the output transmission means, which may comprise a waveguide.

Figure 1:
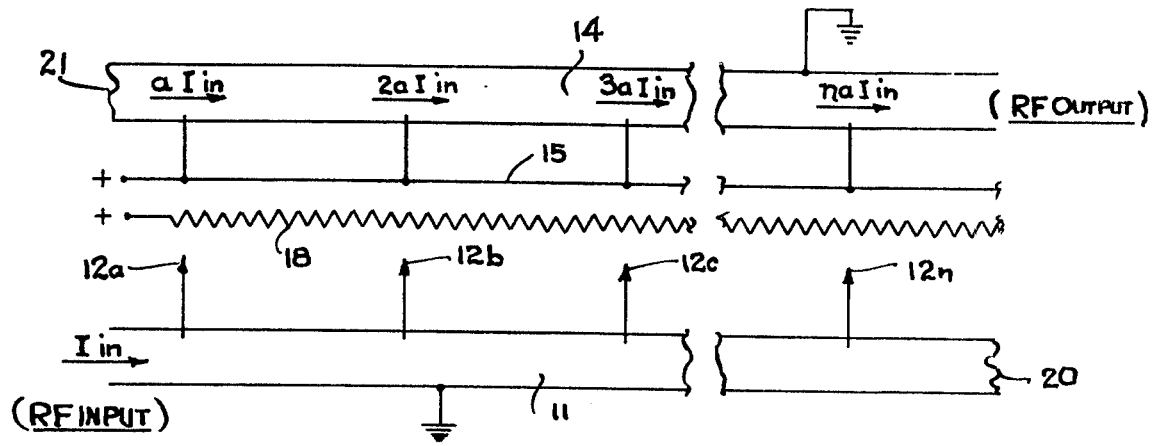
FIG. 1 is a schematic drawing illustrating the operation of the device of the invention.
Figure 3:
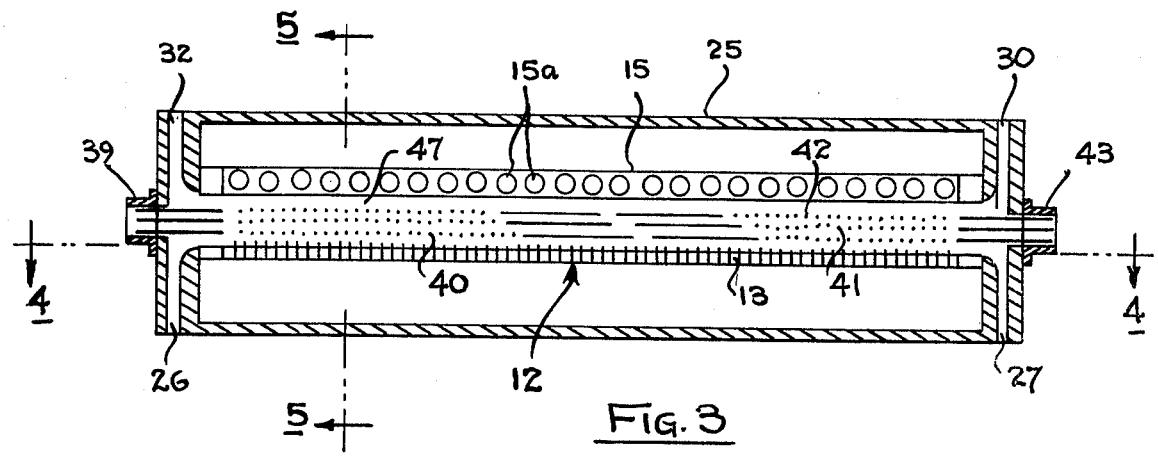
FIG. 3 is a cross-sectional view of the preferred embodiment taken along the plane indicated by 3—3 in FIG. 2.
Figure 4:
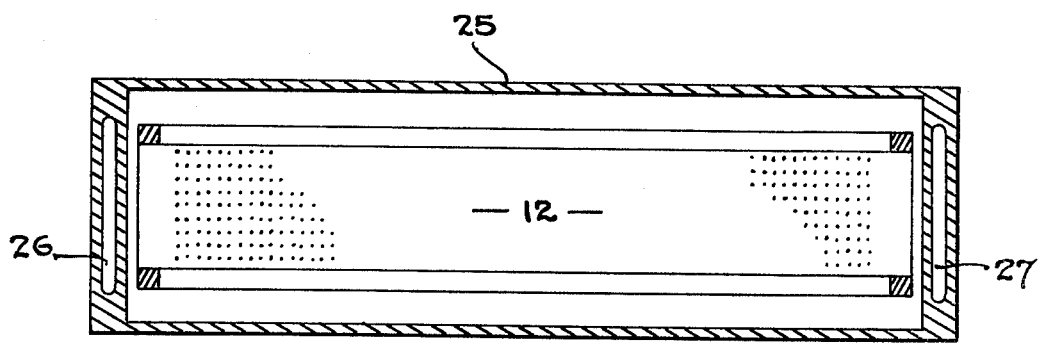
FIG. 4 is a cross-sectional view taken along the plane indicated by 4—4 in FIG. 3.
Figure 5:
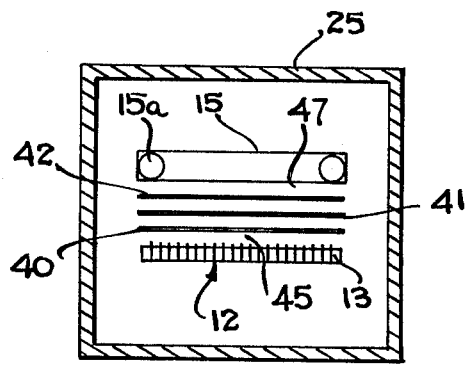
FIG. 5 is a cross-sectional view taken along the plane indicated by 5—5 in FIG. 3.

Referring now to FIG. 1, the device of the invention is schematically illustrated. Microwave energy to be amplified is fed into input transmission means 11 which may comprise an R.F. transmission line. Coupled to the transmission line are the cathodes 12a–12n of an array of such cathodes arranged along transmission line 11. Coupled to output transmission means 14, which may comprise a second transmission line, is a single anode member 15 for all of the cathodes, this anode being spaced from the cathodes. Between the cathodes and the anode is grid means 18, which may comprise one or more grid elements and which controls the flow of electrons between the cathodes and the anode. Grid means 18 and anode 15 both have positive potentials applied thereto so as to cause a flow of electrons from the cathodes to the anode. As to be explained more fully in connection with FIGS. 3–5, there are a plurality of columns of cathodes, the number of such columns being designated by the small letter "a", and the number of rows of cathodes being designated by the small letter "n". The input microwave signal field transmitted along transmission line 11 ($I_{in}$) modulates the grid-cathode potential between each cathode and the grid providing field emission electrons to the output transmission line 14. The modulated R.F. current from a single cathode is $I_{in}$, transmitted in a forward directed traveling wave and an equal out of phase component traveling in a backward directed wave in output transmission line 14. The total modulated current fed to transmission line 14 opposite cathode 12a and the other cathodes in the same row as this cathode will be "a". $I_{in}$. Added the forward directed current will be the current contributed through cathode 12b and the other cathodes in this same row, to provide an in phase forward output current $2a.I_{in}$ opposite cathode 12b. In like manner, the in phase forward output current will be increased to $3a.I_{in}$ opposite cathode 12c and its associated cathodes, and finally with each succeeding row of cathodes additively contributing to the output, a total in phase output current $na.I_{in}$ is developed where "n" is the number of rows "a" is the number of columns of cathodes. Thus it can be seen that substantial amplification of the R.F. input is achieved. The appropriate ends of transmission lines 11 and 14 are terminated by suitable termination loads 20 and 21 to avoid reflections of out of phase signals in these transmission lines.

Figure 2:
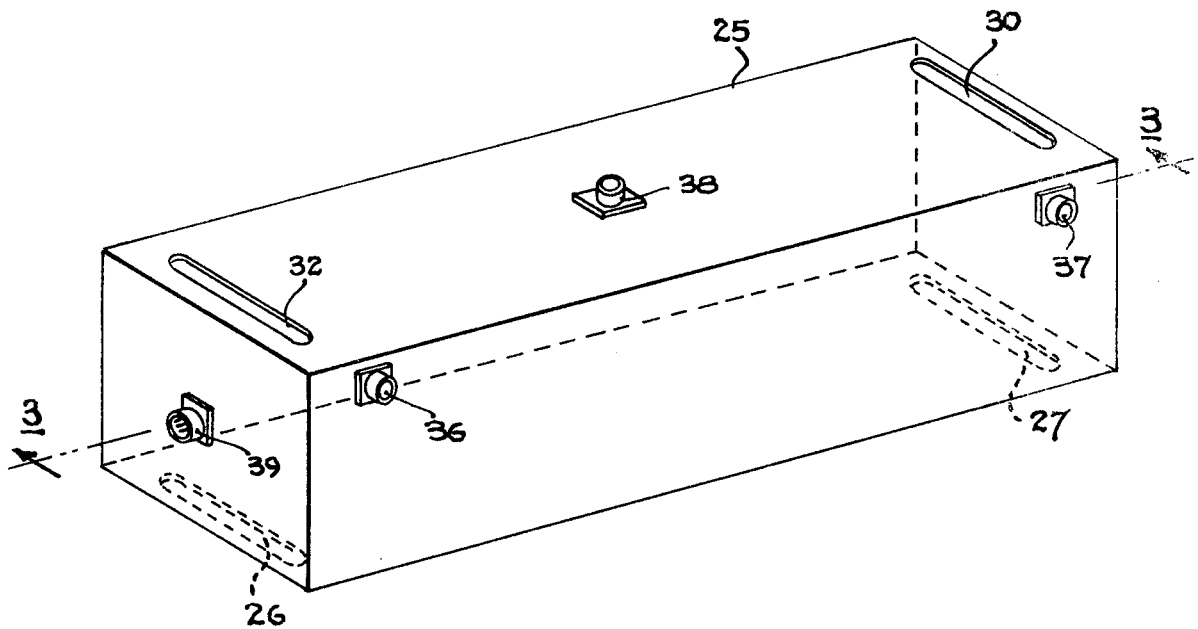
FIG. 2 is a pictorial view illustrating a preferred embodiment of the invention.

Referring now to FIG. 2, a pictorial view showing the outside configuration of the preferred embodiment is shown. The entire unit is contained within metal housing 25 and inlet port 26 is provided for feeding the R.F. input to the input transmission line (not shown) of the amplifier, a port 27 being provided at the opposite end of the transmission line which has a resistive termination (not shown). High power output port 30 is provided in the top wall of housing 25 to couple output signals from the output transmission line (not shown), the other end of this transmission line having a port 32 which has a resistive termination (not shown). An inlet 36 and outlet 37 are provided for handling cooling fluid which is passed through the anode to effect the cooling thereof. A jack 38 is provided for coupling a potential to the anode, a second jack 39 being provided for coupling potentials to the various grids.

Figure 6:
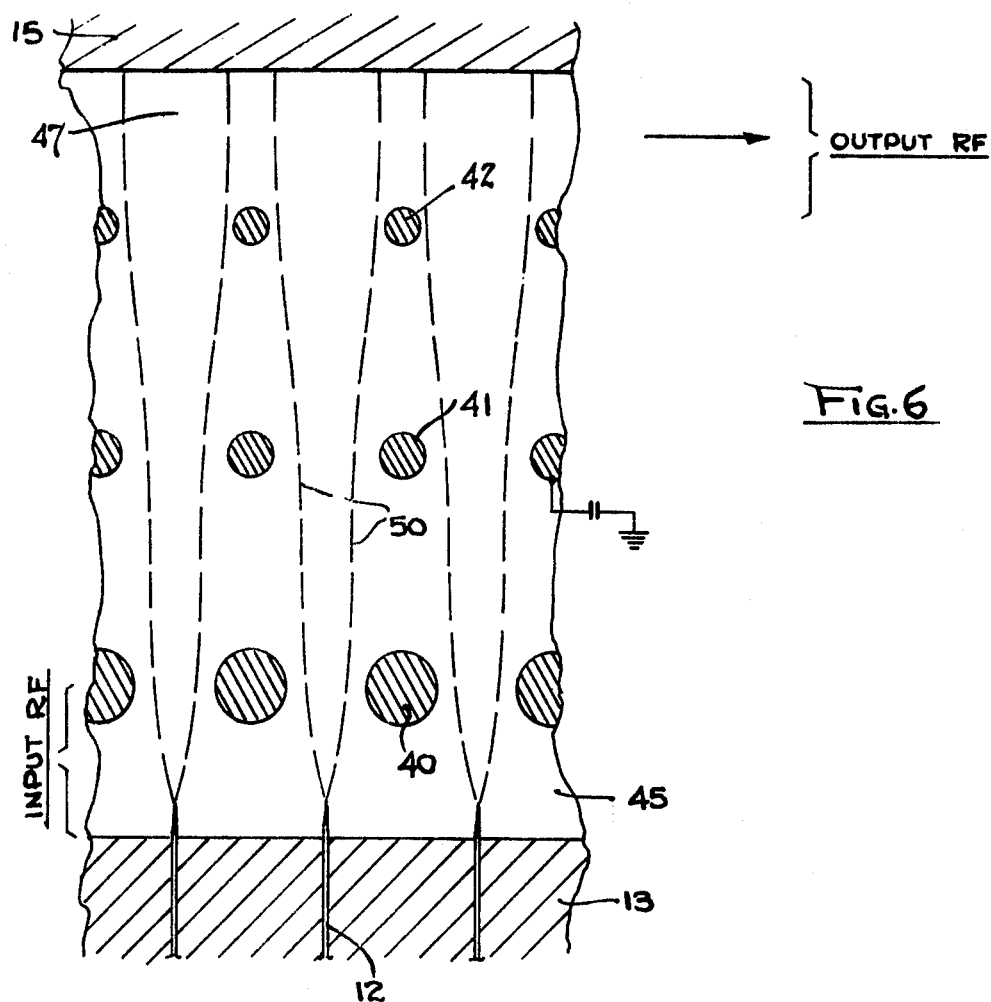
FIG. 6 is an enlarged view illustrating the cathode, anode and grid structure of the preferred embodiment.

Referring now to FIGS. 3-6, the structure of the preferred embodiment is illustrated. The cathodes 12 are arranged in a plurality of columns and rows to form an array covering a predetermined area of interest and are attached to a common bus 13 of a conductive metal. The details of a cathode structure which may be used will be described further on in the specification in connection with FIG. 7. Suffice it to say at this point that each cathode has a sharp pointed tip portion fabricated of a durable material such as tungsten or molybdenum, which is capable of emitting electrons when subjected to a high strength electric field, these being cold cathodes. Spaced from cathodes 12 and substantially parallel and coextensive therewith, is anode 15 which is in the form of a plate formed of a suitable conductive metal such as aluminum or copper. Anode 15 has a plurality of interconnected cooling channels 15a through which a cooling fluid is passed. Placed between cathodes 12 and anode 15 are a plurality of grids, these being successively a cathode grid 40, a decoupling grid 41, and an anode grid 42. These grids may be fabricated of metallic meshes and have various potentials applied thereto to effect the control of the flow of electrons between the cathode and the anode. The details of the grid structure are shown in FIG. 6, and as can be seen, the grid wires have successively smaller diameters and greater mesh spaces in going from the cathode to the anode. While the D.C. potentials applied to the various elements may vary with individual designs, typical values for the various elements are as follows:

Cathode 12 — ground potential
Cathode grid 40 — +500 volts
Decoupling grid 41 — +500 volts (with a bypass capacitor to bring this grid to RF ground potential)
Anode grid 42 — +250 volts
Anode 15 — +500 volts A vacuum tight envelope through which the RF input and output can pass is provided for the area between the cathodes and the anode and this area evacuated to facilitate the electron flow.

The input RF is fed through port 26 to a transmission line section 45, formed along cathodes 12 and terminated at outlet port 27 by an appropriate resistive termination (not shown). A second transmission line 47 is formed along the inner wall of anode 15 and runs from port 32 which is terminated with a suitable resistive termination (not shown), to outlet port 30, from where the high power output energy is taken.

Referring now particularly to FIG. 6, electrons flow from cathodes 12 to anode 15 in beams as indicated by dotted lines 50 and are modulated by the input R.F. fed to transmission line element 45 formed between grid 40 and cathodes 12. The amplified R.F. flows along output transmission line section 47, this energy being additive at each successive row of cathodes along the line, the succeassive energy increments being fed to the transmission line in in-phase relationship determined by the signal velocity (velocity of light) in the input and output transmission lines. Thus the output at port 30 includes the sum of all the increments of R.F. energy fed to transmission line section 47, thereby providing the desired high power output.

Figure 7:
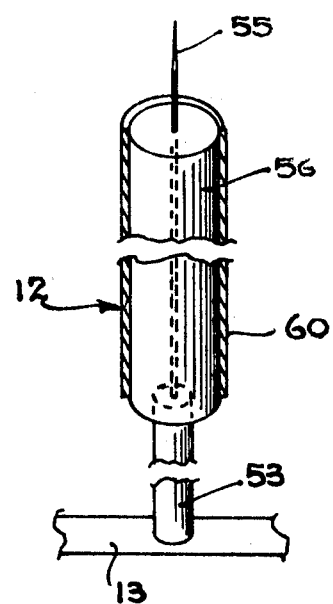
FIG. 7 is an enlarged elevational view illustrating the cathodes of the preferred embodiment.

Referring now to FIG. 7, the details of a cathode structure which may be utilized in the preferred embodiment are illustrated. DC coupling is provided to the cathodes through bus 13 to which a current limiting resistive element 53 is connected. Element 53 may be of a suitable material such as a carbon composition. Electron emitting element 55 is formed by a fine wire, which may be of tungsten or molybdenum. The end portion of element 55 is exposed, with the remaining portion being encapsulated in a sheath 56 of a dielectric material such as Teflon, which may be dipcoated on wire element 55. Wire element 55 is attached at its lower end to resistive element 53 which is also attached to the bottom end of sheath 56 for structural purposes. A metal sheath 60 is deposited on Teflon sheath 56, metal sheath 60 being grounded. Teflon member 56 thus forms an R.F. bypass capacitor to eliminate R.F. from the DC circuit. Typically, cathode element 55 may have a diameter of the order of 4 micrometers, with sheath 56 having a diameter of the order of 75 micrometers. The cathodes 12 may be formed by means other than that just described, this being but one example of a structure that may be utilized. It is to be noted that conventional field emission cold cathodes without the by-pass capacitance and current limiting resistance of the present device are well known in the art and are described, for example, on Pages 283-304 of "ADVANCES IN ELECTRONICS AND ELECTRON PHYSICS" published in 1973 by the Academic Press, and an article published in the May 1960 edition of the *Journal of Applied Physics* (Pages 782-789), entitled "STABLE, HIGH-DENSITY FIELD EMISSION COLD CATHODE", by E. E. Martin et al.

While the invention has been described and illustrated in detail, it is to be clearly understood that this is intended by way of illustration and example only and is not to be taken by way of limitation, the spirit and scope of this invention being limited only by the terms of the following claims.

I claim:

1. A traveling wave tube amplifier for amplifying radio frequency energy comprising:

a plurality of field emission cathodes arranged in an array covering a predetermined area, an anode positioned opposite said cathode array in spaced relationship thereto and covering an area substantially corresponding to said predetermined area, grid means placed between the cathodes and the anode, first radio frequency energy transmission means formed between said cathodes and said grid means, means for coupling radio frequency energy to be amplified solely to one end of said first radio frequency energy transmission means, second radio frequency energy transmission means formed between the anode and the grid means, and means for coupling out amplified radio frequency energy solely from one end of said second radio frequency energy transmission means, there being potentials applied to the anode and grid means relative to the cathode to cause an electron flow from each of said cathodes to said anode, said electron flows being modulated by the radio frequency energy coupled to said first radio frequency energy transmitting means, the modulated electron flows being additively fed in phase with each other to said second radio frequency energy transmission means to provide the amplified output therefrom.

2. The amplifier of claim 1 wherein the radio frequency energy is at microwave frequencies, the transmission means comprising first and second tranmission lines 3. The amplifier of claim 1 wherein said cathodes comprise fine wire elements.

4. The amplifier of claim 3 wherein said elements are arranged in rows and columns.

5. The amplifier of claim 1 wherein said anode is in the form of a flat plate having apertures therein forming a fluid cooling channels.

6. The amplifier of claim 1 wherein said grid means comprises a cathode grid closest to said cathodes, an anode grid closest to said anode and a decoupling grid between the cathode and anode grids.

7. The amplifier of claim 2 and further including a resistive termination at the end of said first transmission line opposite to said one end thereof and a resistive termination at the end of said second transmission line opposite to said one end thereof.

8. A traveling wave tube amplifier for amplifying microwave energy comprising:

a plurality of field emission cold cathodes arranged in an array covering a predetermined area, an anode positioned opposite said cathode array in spaced relationship thereto and covering an area substantially corresponding to said predetermined area, grid means placed between the cathodes and the anode to control the electron flow therebetween, first transmission line means formed between said cathodes and said anode, means for coupling microwave energy to be amplified solely to one end of said first transmission line means, second transmission line means formed between said anode and said grid means, and means for coupling out microwave energy solely from one end of said second transmission line means, potentials being applied to the anode and grid means relative to the cathodes so as to cause a beam of electrons to flow between each cathode and the anode, said beams being modulated by the microwave energy in said first transmission line means, the modulated beams being additively coupled in phase with each other to the second transmission line means to provide the amplified output therefrom.

9. The amplifier of clam 8 wherein said cathodes comprise fine wire elements.

10. The amplifier of claim 8 wherein said cathodes further comprise a common bus and current limiting resistive elements interconnecting the wire elements and the bus.

11. The amplifier of claim 1 wherein the anode comprises a plate having apertures therein forming a fluid cooling channel.

12. The amplifier of claim 1 wherein said grid means comprises a cathode grid closest to said cathodes, an anode grid closest to said anode and a decoupling grid between the anode and cathodes.

13. The amplifier of claim 8 and further including resistive terminations for each of said transmission line means to prevent reflections therein, said resistive terminations being coupled to the ends of said transmission line means opposite to said one ends thereof.

* * * * *